United States Patent
Morisaki

(10) Patent No.: US 12,255,202 B2
(45) Date of Patent: Mar. 18, 2025

(54) SHORT CIRCUIT DETECTION APPARATUS

(71) Applicant: Mitsubishi Electric Corporation, Tokyo (JP)

(72) Inventor: Chiharu Morisaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 17/872,356

(22) Filed: Jul. 25, 2022

(65) Prior Publication Data

US 2023/0126872 A1  Apr. 27, 2023

(30) Foreign Application Priority Data

Oct. 22, 2021  (JP) .................................. 2021-172828

(51) Int. Cl.
*H01L 27/02* (2006.01)
*H01L 27/06* (2006.01)
(Continued)

(52) U.S. Cl.
CPC ...... *H01L 27/0288* (2013.01); *H01L 27/0682* (2013.01); *H02H 3/023* (2013.01); *H02H 3/202* (2013.01)

(58) Field of Classification Search
CPC ............. H01L 27/0288; H01L 27/0682; H01L 27/0255; H02H 3/023; H02H 3/202; H03K 17/0822; H03K 17/18
(Continued)

(56) References Cited

U.S. PATENT DOCUMENTS 5,500,616 A * 3/1996 Ochi .................. H03K 17/0822
327/422
2016/0028219 A1  1/2016 Habu et al.
(Continued)

FOREIGN PATENT DOCUMENTS

WO  2014/115272 A1  7/2014

OTHER PUBLICATIONS

Comparison and Discussion on Shortcircuit Protections for Silicon-Carbide MOSFET Modules: Desaturation Versus Rogowski Switch-Current Sensor, in IEEE Transactions on Industry Applications, vol. 56, No. 3, pp. 2880-2893, May-Jun. 2020, doi: 10.1109/TIA.2020. 2972816 (Year: 2020).*

(Continued)

*Primary Examiner* — Scott Bauer
*Assistant Examiner* — Sreeya Sreevatsa
(74) *Attorney, Agent, or Firm* — Sughrue Mion, PLLC

(57) ABSTRACT

A short circuit detection apparatus includes a capacitor connected to a high potential side of a semiconductor switching device via a diode and a resistor connected in series, a short circuit determination circuit that detects a terminal voltage of one terminal of the capacitor, and determines that the semiconductor switching device has short-circuited when the terminal voltage is equal to or greater than a threshold voltage, and a voltage control circuit that is provided between another terminal of the capacitor and a low potential side of the semiconductor switching device, switches between a conduction and an interruption of the capacitor and the semiconductor switching device, and applies an offset voltage between the capacitor and the semiconductor switching device when conducting.

9 Claims, 5 Drawing Sheets

(51) Int. Cl.
  *H02H 3/02* (2006.01)
  *H02H 3/20* (2006.01)
(58) Field of Classification Search
  USPC .......................................................... 361/94
  See application file for complete search history.

(56) References Cited

U.S. PATENT DOCUMENTS

2019/0386654 A1* 12/2019 Norling .............. H03K 17/0826
2021/0028778 A1* 1/2021 Aeloiza .............. H03K 17/0822

OTHER PUBLICATIONS

S. Mocevic et al., "Comparison and Discussion on Shortcircuit Protections for Silicon-Carbide MOSFET Modules: Desaturation Versus Rogowski Switch-Current Sensor," in IEEE Transactions on Industry Applications, vol. 56, No. 3, pp. 2880-2893, May-Jun. 2020, doi: 10.1109/TIA.2020.2972816) (Year: 2020).*

B. Yu, X. Guo, X. Bu and J. Wu, "Research on the SiC MOSFETs Short Circuit Detection and Protection optimization Method," 2020 IEEE Vehicle Power and Propulsion Conference (VPPC), Gijon, Spain, 2020, pp. 1-7, doi: 10.1109/VPPC49601.2020.9330860 (Year: 2020).*

Y. Gui, B. Sun, R. Burgos, J. Xu and S. Bala, "Desaturation Detection for Paralleled GaN E-HEMT Phase Leg," 2018 IEEE Energy Conversion Congress and Exposition (ECCE), Portland, OR, USA, 2018, pp. 3503-3509, doi: 10.1109/ECCE.2018.8558252 (Year: 2018).*

J. Person, M. Andresen, T. Rettmann, O. Muehlfeld and M. Liserre, "Short Circuit Detection Methods for Silicon Carbide (SiC) Power Semiconductors," PCIM Europe 2019; International Exhibition and Conference for Power Electronics, Intelligent Motion, Renewable Energy and Energy Management, Nuremberg (Year: 2019).*

* cited by examiner

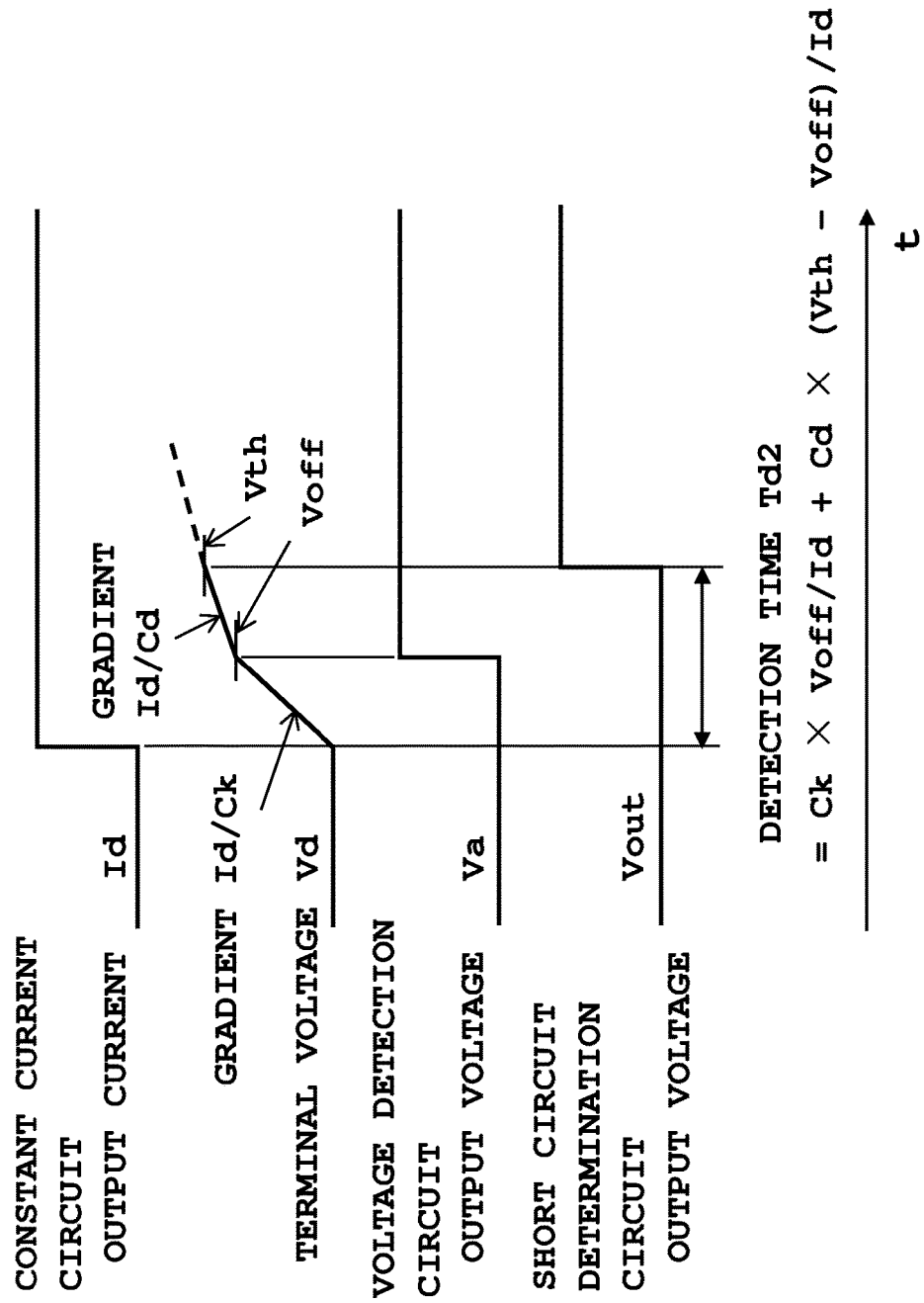

SHORT CIRCUIT DETECTION APPARATUS

BACKGROUND OF THE INVENTION

Technical Field

The present application relates to the field of a short circuit detection apparatus that detects, for example, a short circuit of a semiconductor switching device.

Description of the Background Art

For example, a method whereby an inter-terminal voltage of a semiconductor switching device is detected (a DESAT method) is already known as a semiconductor switching device short circuit detecting function. Specific examples of "inter-terminal voltage" in this case are a collector-emitter voltage when the semiconductor switching device is, for example, an insulated gate bipolar transistor (IGBT), and a source-drain voltage when the semiconductor switching device is a MOSFET. Normally, when a semiconductor switching device is in an on-state, the inter-terminal voltage of the semiconductor switching device drops, and stabilizes at a certain minimum voltage.

Meanwhile, when a semiconductor switching device is in a short-circuited state, the inter-terminal voltage of the semiconductor switching device rises due to an overcurrent. Due to the inter-terminal voltage rising, the inter-terminal voltage becomes an abnormal voltage that cannot occur in a normal on-state. A short-circuit of a semiconductor switching device can be detected by detecting this abnormal voltage (for example, refer to WO2014/115272).

Herein, a method disclosed in WO2014/115272 is such that a high withstand voltage diode and a capacitor are disposed between a semiconductor device drive circuit and a semiconductor switching device, and the semiconductor switching device being in a short-circuited state is detected by charging the capacitor when the semiconductor switching device is short-circuited. Specifically, voltage of a terminal VDSH rises owing to the capacitor being charged by a constant current circuit, and when the voltage of the terminal VDSH is of a certain value or greater, it is determined that a short circuit has occurred in the semiconductor switching device.

However, the DESAT method used in the semiconductor device of WO2014/115272 is such that for a time between the capacitor being charged by the constant current circuit and a determination that the semiconductor switching device is short-circuited, the short circuit of the semiconductor switching device is in a continuing state, and during this time, there is a possibility of a problem occurring in the semiconductor switching device itself, or in an upstream mechanism that supplies power to a power conversion device, due to heat generated during the short circuit. Because of this, in the DESAT method, it is required to quickly process from the occurrence of a short circuit to the determination. Therefore, a method whereby an energizing current of the constant current circuit is increased is commonly known, but increasing a circuit current consumption is not suitable for a power conversion device for which power saving is required. Meanwhile, a method whereby charging is accelerated by a capacitance of the capacitor being reduced is also known, but as the terminal VDSH is susceptible to voltage fluctuation due to an external circuit factor, there is a problem in that there is a possibility of erroneously determining that there is a short circuit due to an effect of noise or the like.

SUMMARY OF THE INVENTION

The present application has been made to resolve the above problem, and an object of the present application is to provide a short circuit detection apparatus such that a semiconductor switching device short circuit determination can be executed quickly, with no need to increase a capacitor charging current or to reduce a capacitance of the capacitor.

A short circuit detection apparatus disclosed in the present application includes a capacitor connected to a high potential side of a semiconductor switching device via a diode and a resistor connected in series, a short circuit determination circuit that detects a terminal voltage of one terminal of the capacitor, and determines that the semiconductor switching device has short-circuited when the terminal voltage is equal to or greater than a threshold voltage, and a voltage control circuit that is provided between another terminal of the capacitor and a low potential side of the semiconductor switching device, switches between a conduction and an interruption of the capacitor and the semiconductor switching device, and applies an offset voltage between the capacitor and the semiconductor switching device when conducting.

The short circuit detection apparatus disclosed in the present application can execute charging of a capacitor only in a range higher than a set offset voltage when a semiconductor switching device short-circuits, because of which there is an advantage in that a short circuit of a semiconductor switching device can be detected and determined quickly, without an energizing current of a constant current circuit being increased.

The foregoing and other objects, features, aspects, and advantages of the present application will become more apparent from the following detailed description of the present application when taken in conjunction with the accompanying drawings.

BRIEF DESCRIPTION OF THE DRAWINGS

FIGS. 2A and 2B are time charts for describing an advantage of an operation of the short circuit detection apparatus according to the first embodiment.

DESCRIPTION OF THE PREFERRED EMBODIMENTS

First Embodiment

Figure 1:
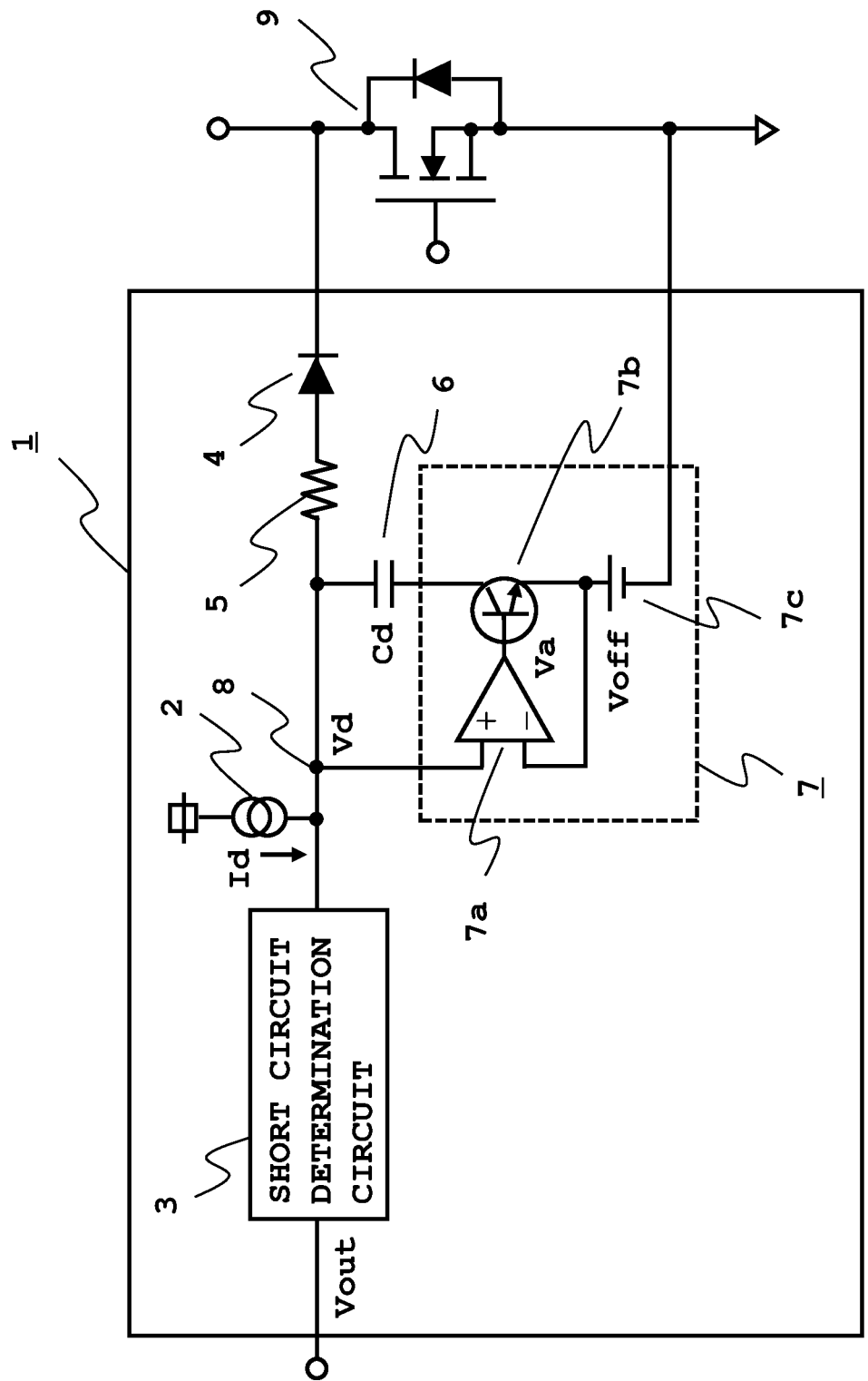
FIG. 1 is a block diagram of the system configuration including a semiconductor switching device to which a short circuit detection apparatus according to a first embodiment is connected.
Figure 2A:
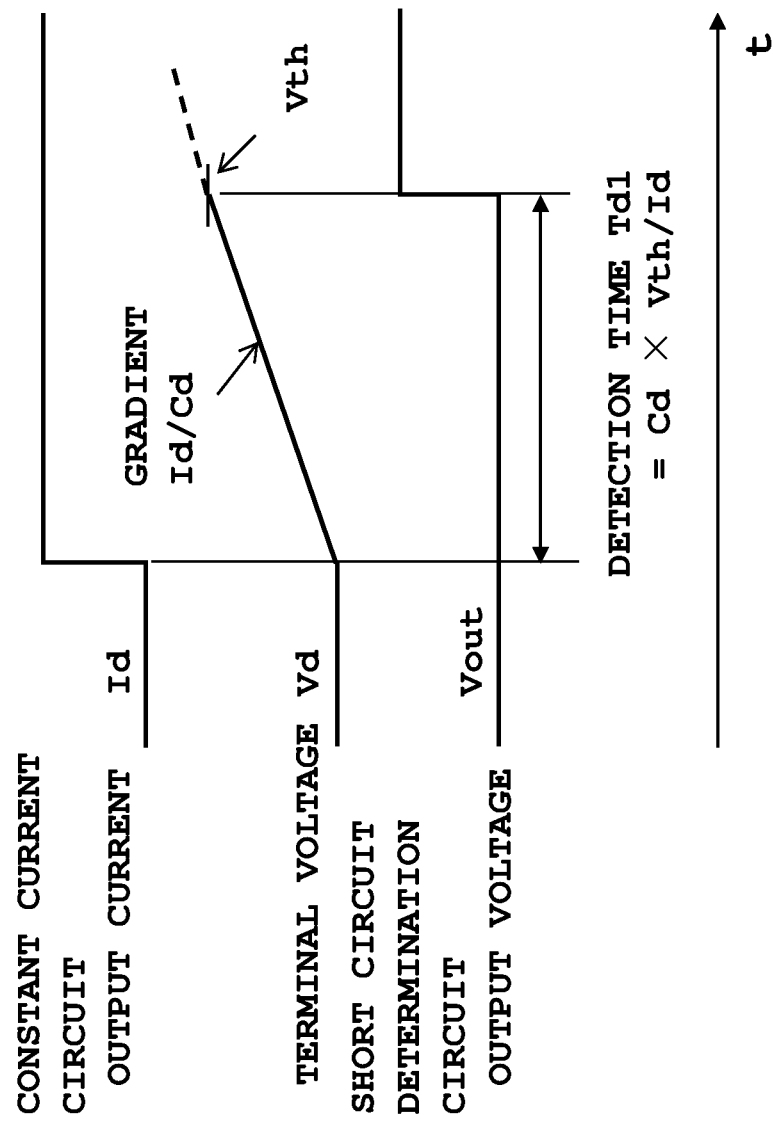

FIG. 1 is a circuit block diagram showing a system configuration including a semiconductor switching device to which a short circuit detection apparatus according to a first embodiment is connected. FIGS. 2A and 2B are time charts for describing an advantage of an operation of the short circuit detection apparatus according to the first embodiment. The present application is applied to, for example, a short circuit detection apparatus that detects a short circuit of a semiconductor switching device of an inverter of a power conversion device used for driving an automobile motor.

Firstly, using FIG. 1, a configuration of the short circuit detection apparatus according to the first embodiment will be described. FIG. 1 includes a semiconductor switching device 9, which is a target of a short circuit determination.

A short circuit detection apparatus 1 is configured of a constant current circuit 2, a short circuit determination circuit 3, which determines that there is a short circuit of the semiconductor switching device 9 based on a terminal voltage of a terminal 8 connected to the constant current circuit 2, a diode 4, whose cathode is connected to a high potential side terminal of the semiconductor switching device 9, a resistor 5 and a capacitor 6 connected between the diode 4 and the terminal 8, and a voltage control circuit 7 connected to the terminal 8, the capacitor 6, and a low potential side terminal of the semiconductor switching device 9. A difference from a general, existing configuration is the existence of the voltage control circuit 7, as in the existing configuration, the capacitor 6 is connected directly to the low potential side of the semiconductor switching device 9.

The voltage control circuit 7 is configured of a voltage detection circuit 7a, which carries out a comparative determination and an amplification of the terminal voltage of the terminal 8, a switch 7b, which is an active element that is installed between the capacitor 6 and the low potential side terminal of the semiconductor switching device 9, and which carries out a conduction and an interruption, and an offset voltage source 7c connected to the switch 7b. These configurations are the same as a circuit configuration called a shunt regulator. FIG. 1 shows an example wherein a comparator is used as the voltage detection circuit 7a. Also, FIG. 1 shows an example wherein a bipolar transistor is used as the switch 7b, a base terminal is connected to the voltage detection circuit 7a, a collector terminal is connected to the capacitor 6, and an emitter terminal is connected to the offset voltage source 7c. An example wherein a battery is used as the offset voltage source 7c is shown.

Next, with regard to a relationship between a semiconductor switching device short circuit detection operation and a detection time, a difference between the configuration of the first embodiment and an existing configuration will be described using time charts shown in FIGS. 2A and 2B.

Firstly, an existing configuration shown in FIG. 2A is such that when the semiconductor switching device 9 short-circuits, a terminal voltage Vd of the terminal 8 rises at a constant gradient (Id/Cd) due to an output current Id of the constant current circuit 2 and a capacitance Cd of the capacitor 6. When a threshold voltage at which it is determined that there is a short circuit of the semiconductor switching device 9 is Vth, the short circuit determination circuit 3 detects a detection time Td1, which is a time in which the terminal voltage Vd of the terminal 8 reaches the threshold voltage Vth.

Herein, the detection time Td1 in which it is determined by the short circuit determination circuit 3 that there is a short circuit is such that Td1=Cd×Vth/Id, as shown in FIG. 2A. Because of this, the short circuit determination circuit 3, on detecting that the terminal voltage Vd of the terminal 8 has reached the threshold voltage Vth, determines that the semiconductor switching device 9 has short-circuited, and outputs an output voltage Vout in order to notify an external circuit instrument (not shown) of the detection time Td1 (herein, a case wherein the output voltage rises is shown).

As opposed to this, the configuration of the first embodiment shown in FIG. 2B is such that the switch 7b is in an off-state in an initial state of the voltage control circuit 7. In this state, a low potential side of the capacitor 6 is not electrically fixed, and the capacitor 6 is in a state wherein a function as a capacitor is not exercised, because of which no charging of the capacitor 6, whose capacitance is Cd, is carried out, and the terminal voltage Vd of the terminal 8 rises at a steep gradient. Specifically, charging is carried out only by a slight parasitic capacitance component existing in wiring of the terminal 8, meaning that when the parasitic capacitance of the wiring is Ck, the gradient of the voltage rise is (Id/Ck). Although depending also on circuit configuration, a parasitic capacitance component is generally extremely small with respect to the capacitor 6 (Cd>>Ck).

When the semiconductor switching device 9 short-circuits, the switch 7b is turned on by an output voltage Va of the voltage detection circuit 7a after the terminal voltage Vd of the terminal 8 reaches an offset voltage Voff preset in the offset voltage source 7c, and the low potential side of the capacitor 6 is fixed at the offset voltage Voff. That is, the terminal voltage Vd causes a conduction between the capacitor 6 and the semiconductor switching device 9 when reaching the same potential as the offset voltage Voff. Because of this, charging of the capacitor 6 of the capacitance Cd is started, and the gradient of the voltage rise changes to (Id/Cd). When a threshold voltage at which it is determined that there is a short circuit of the semiconductor switching device 9 is Vth, the short circuit determination circuit 3 detects a detection time Td2, which is a time in which the the terminal voltage Vd of the terminal 8 reaches the threshold voltage Vth.

Herein, the detection time Td2 in which it is determined by the short circuit determination circuit 3 that there is a short circuit is such that Td2=Ck×Voff/Id+Cd×(Vth−Voff)/Id, as shown in FIG. 2B. Because of this, the short circuit determination circuit 3, on detecting that the terminal voltage Vd of the terminal 8 has reached the threshold voltage Vth, determines that the semiconductor switching device 9 has short-circuited, and outputs an output voltage Vout in order to notify an external circuit instrument (not shown) of the detection time Td2 (herein, a case wherein the output voltage rises is shown).

Consequently, the first embodiment of FIG. 2B is such that when the semiconductor switching device 9 short-circuits, the terminal voltage Vd of the terminal 8 increases sharply as far as the offset voltage Voff, and subsequently rises at the gradient (Id/Cd). Meanwhile, in FIG. 2A, in which there is no voltage control circuit, the terminal voltage Vd of the terminal 8 rises gently at the gradient (Id/Cd) only. The time until reaching the threshold voltage Vth in FIG. 2B (the detection time Td2) is shorter than the time until reaching the threshold voltage Vth in FIG. 2A (the detection time Td1). Because of this, a short circuit of the semiconductor switching device 9 can be detected in a shorter time.

As one example, when the parasitic capacitance Ck is sufficiently small not to have effectiveness with respect to the capacitance Cd of the capacitor 6, and the offset voltage Voff is set to be one-half of the threshold voltage Vth, the semiconductor switching device 9 short circuit detection time Td2 (=Cd×(0.5×Vth)/Id=1/2×Td1) is such that a short circuit detection can be realized in a time that is one-half of the semiconductor switching device 9 short circuit detection time Td1 in the case of the existing configuration, which does not have a voltage control circuit.

The offset voltage Voff must always be set to be smaller than the threshold voltage Vth. A reason for this is that in order not to erroneously detect a short circuit due to a transient factor caused by disturbance noise, a need to cause a filtering advantage of the capacitor 6 to be exercised arises in a voltage range in a vicinity of the threshold voltage Vth.

Specifically, in a normal drive state of the semiconductor switching device 9, a total of a voltage generated at the high potential side terminal owing to an ON resistance of the semiconductor switching device 9 and a current flowing between the terminals, an on-state voltage of the diode 4, and a voltage generated in the resistor 5 by the output current Id of the constant current circuit 2 is generated at the terminal 8 as a steady voltage component, because of which the offset voltage Voff is desirably set to be equal to or smaller than the steady voltage, in order that a filtering advantage can be exercised in a range higher than the steady voltage. That is, the offset voltage Voff is set to be equal to or smaller than the terminal voltage Vd generated in an input of the short circuit determination circuit 3 when the semiconductor switching device 9 is being driven normally, wherein the capacitor 6 and the semiconductor switching device 9 can be conductive when the semiconductor switching device 9 is being driven normally.

A short circuit detection apparatus according to the first embodiment is such that by a voltage control circuit configured of a voltage detection circuit, which carries out a comparative determination and an amplification of a terminal voltage, a switching element, which is installed between a capacitor and a low potential side terminal of a semiconductor switching device, and an offset voltage source being provided in this way, charging of the capacitor is carried out only in a range higher than an offset voltage, because of which there is an advantage in that a short circuit of the semiconductor switching device can be detected and determined quickly, without an energizing current of a constant current circuit being increased.

Second Embodiment

Figure 3:
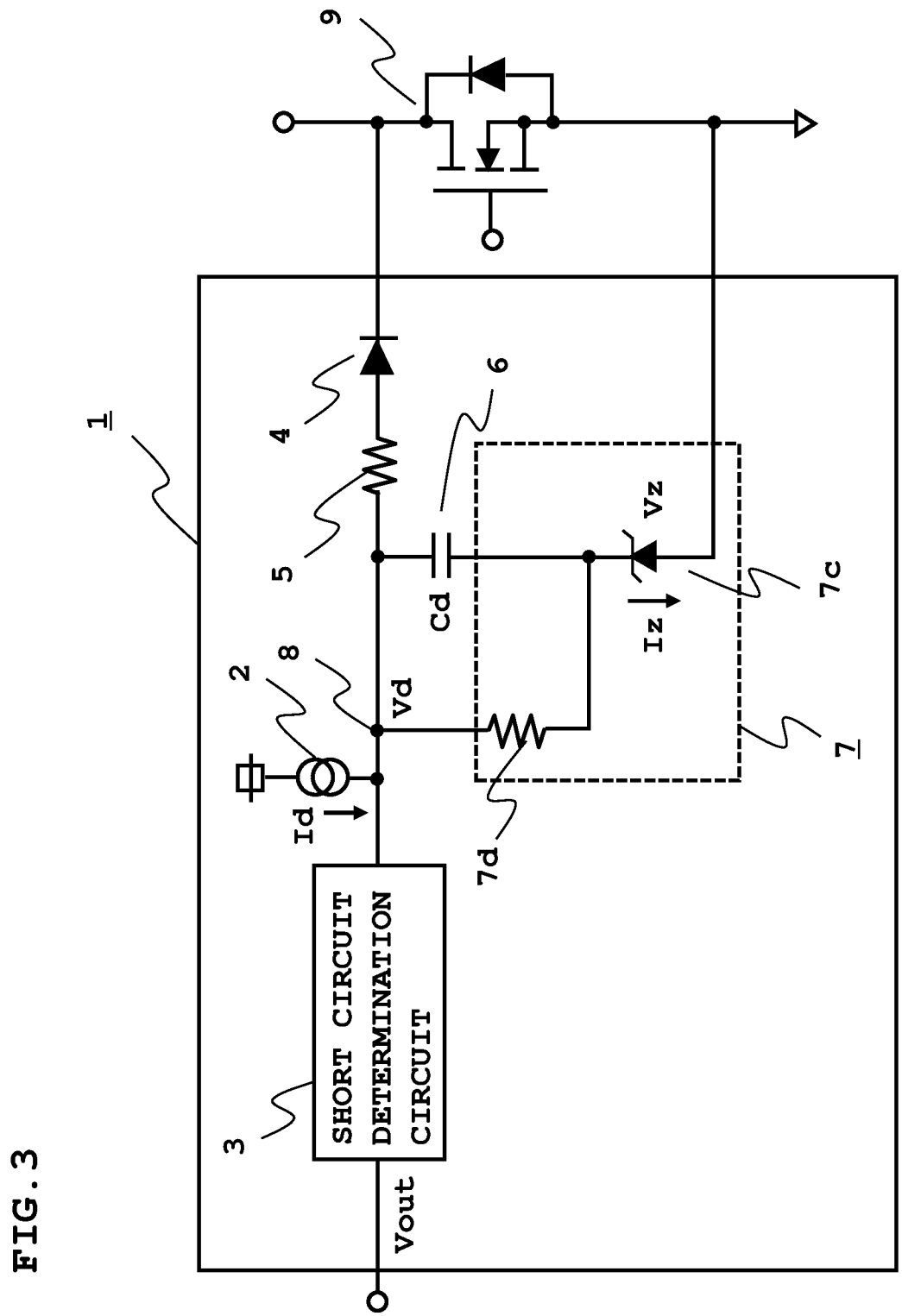
FIG. 3 is block diagram of the system configuration including a semiconductor switching device to which a short circuit detection apparatus according to a second embodiment is connected.

FIG. 3 is a circuit block diagram showing a system configuration including a semiconductor switching device to which a short circuit detection apparatus according to a second embodiment is connected. A difference from the first embodiment is that the voltage control circuit 7 of the short circuit detection apparatus 1 of the second embodiment is configured of a second resistor 7d, which is connected in parallel to the capacitor 6, and a Zener diode 7e, which is connected in series to the capacitor 6. The Zener diode 7e is such that an anode is connected to the low potential side of the semiconductor switching device 9, and a cathode is connected to a capacitor. The Zener diode 7e corresponds to all of the voltage detection circuit 7a, the switch 7b, and the offset voltage source 7c of the first embodiment. As other configurations are the same as in the first embodiment, a description will be omitted. A characteristic of the present embodiment is that as circuit components are generally small and low-cost, a small number of circuit components is sufficient, and the circuit components themselves require no power for an operation, practicality is extremely high.

Next, based on FIG. 3, an operation of the short circuit detection apparatus according to the second embodiment will be described in detail, focusing on a difference from the first embodiment. FIG. 3 includes the semiconductor switching device 9, which is a target of a short circuit determination.

A specific operation will be described. In an initial state, the Zener diode 7e is in an off-state, and the voltage Vd of the terminal 8 rises at a steep gradient, in the same way as in the first embodiment. The terminal voltage Vd is input into the cathode of the Zener diode 7e via the second resistor 7d, meaning that when an on-state voltage (a conduction voltage) of the Zener diode 7e is Vz, the Zener diode 7e switches to an on-state at a point at which Vd=Vz is reached. That is, Voff in the first embodiment corresponds to Vz, and an on-state of the Zener diode 7e corresponds to an on-state of the switch 7b of the first embodiment.

Consequently, charging of the capacitor 6 is carried out in a range wherein Vd>Vz, in the same way as in the case of the first embodiment, but an on-state current flowing into the Zener diode 7e via the second resistor 7d is generated when the Zener diode 7e is in an on-state, meaning that when the on-state current is Iz, the gradient of the rise of the terminal voltage Vd of terminal 8 is (Id−Iz)/Cd. As a result of this, the short circuit detection time Td2 is Td2=Ck×Voff/(Id−Iz)+Cd×(Vth−Voff)/(Id−Iz).

Because of this, the short circuit determination circuit 3, on detecting that the terminal voltage Vd of the terminal 8 has reached the threshold voltage Vth, determines that the semiconductor switching device 9 has short-circuited, and outputs the output voltage Vout in order to notify an external circuit instrument (not shown) of the detection time Td2 (herein, a case wherein the output voltage rises is shown).

As an object of the present application is to accelerate charging of the capacitor 6 and quickly detect a short circuit of the semiconductor switching device 9, the current Iz that flows through the Zener diode 7e is desirably set to be as small as possible within a range wherein an on-state of the Zener diode 7e can continue stably, and the second resistor 7d is provided with an object of adjusting the current Iz.

The Zener diode 7e used in the present embodiment generally needs a current of several microamps to several tens of microamps in order for an on-state to continue stably, meaning that when, for example, the output current Id of the constant current circuit 2 is a current in the region of 1 mA, a constant of the second resistor 7d needs to be adjusted in such a way that the current Iz that flows through the Zener diode 7e is in the region of one-tenth of the output current Id of the constant current circuit 2, or less than one-tenth. An offset voltage can be adjusted by using Zener diodes of differing conduction voltages (breakdown voltages).

A short circuit detection apparatus according to the second embodiment is such that by a voltage control circuit configured of a resistor connected in parallel to a capacitor and a Zener diode connected in series to the capacitor being provided in this way, charging of the capacitor is carried out only in a range higher than a set offset voltage, in the same way as in the first embodiment, because of which there is an advantage in that a short circuit of a semiconductor switching device can be detected and determined quickly, without an energizing current of a constant current circuit being increased. Also, the voltage control circuit of the second embodiment is such that an excellent advantage can be expected in that the number of circuit components is small, and a short circuit detection determination can reliably be executed using a simple configuration.

Third Embodiment

Figure 4:
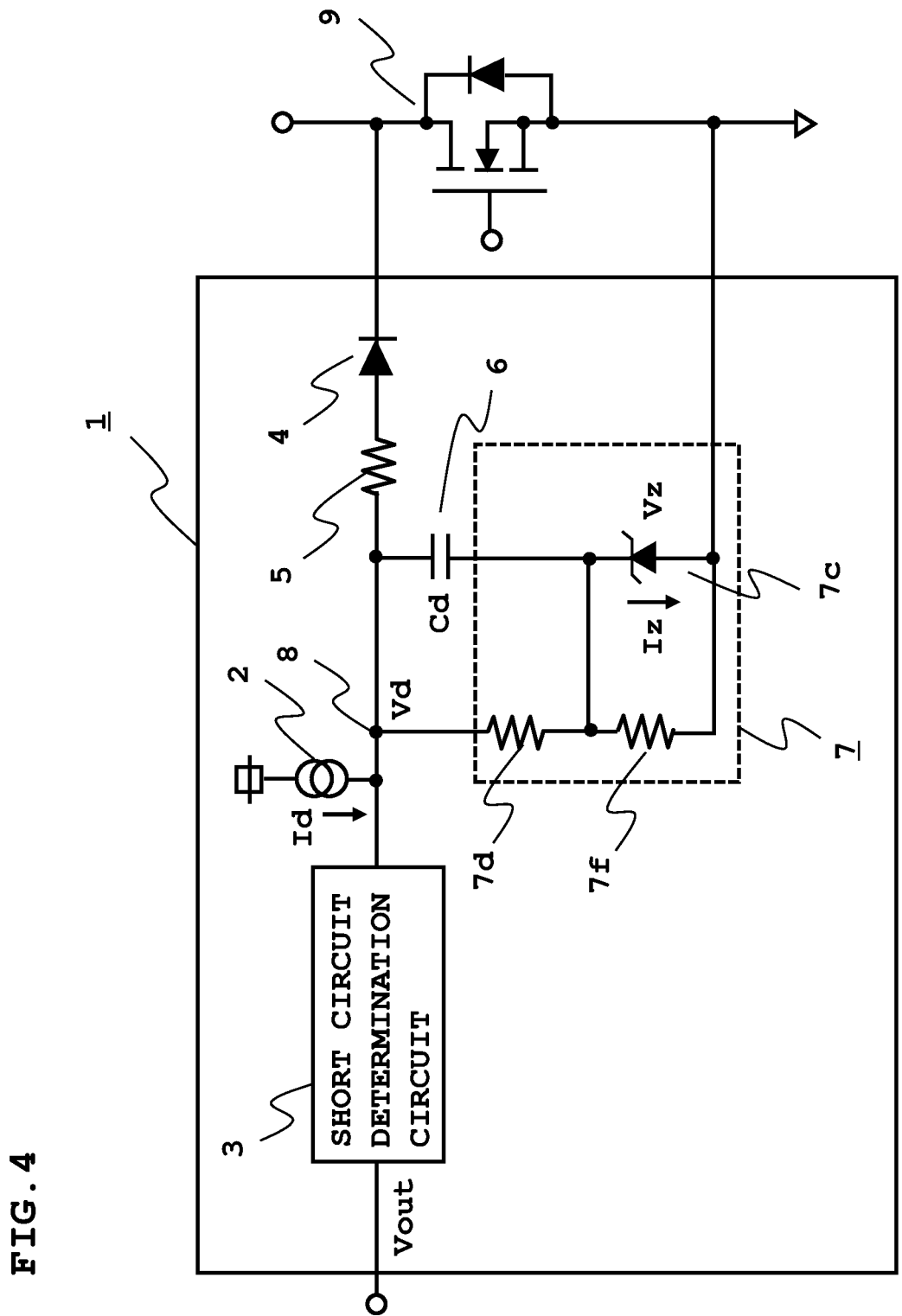
FIG. 4 is a block diagram of the system configuration including a semiconductor switching device to which a short circuit detection apparatus according to a third embodiment is connected.

FIG. 4 is a circuit block diagram showing a system configuration including a semiconductor switching device to which a short circuit detection apparatus according to a third embodiment is connected. A difference from the second embodiment is that with respect to the configuration of the voltage control circuit 7 of the short circuit detection apparatus 1 of the second embodiment, a third resistor 7f is further provided in parallel with the Zener diode 7e. As other configurations are the same as in the second embodiment, a description will be omitted. An object of the third embodiment is to restrict an effect caused by an individual difference in conduction voltage of the Zener diode 7e, that is, a variation in the detection time Td2 in which a short circuit of the semiconductor switching device 9 is detected.

In the present embodiment, a description will be given focusing on an advantage provided by the third resistor 7f. Generally, the on-state voltage Vz of a Zener diode has positive characteristics with respect to a change in the on-state current Iz. This means that when, for example, the on-state voltage Vz is somewhat low due to an individual difference, an effect of the individual difference can desirably be canceled by causing the on-state current Iz to increase, thereby causing the on-state voltage Vz to rise.

In the case of the configuration of the second embodiment, a relationship between the on-state voltage Vz of the Zener diode 7e and the on-state current Iz when a resistance value of the second resistor 7d is Rd can be expressed as $$Iz=(Vd-Vz)/Rd \quad (1),$$

and furthermore, by converting Equation (1), can be expressed as $$Iz+Vz/Rd=Vd/Rd \quad (2).$$

The equations above that represent a correlation between the on-state voltage Vz of the Zener diode 7e and the on-state current Iz mean that in order to cause an equality to be satisfied when a change occurs in the on-state voltage Vz due to an individual difference, the on-state current Iz changes to an opposite direction in the circuit configuration, and the effect of the individual difference of the Zener diode 7e is canceled.

Meanwhile, in the case of the configuration of the third embodiment, a relationship between the on-state voltage Vz of the Zener diode 7e and the on-state current Iz when a resistance value of the third resistor 7f is Rf can be expressed as $$Iz=(Vd-Vz)/Rd-Vz/Rf \quad (3),$$

and furthermore, by converting Equation (3), can be expressed as $$Iz+Vz(1/Rd+1/Rf)=Vd/Rd \quad (4).$$

In the same way as in the case of Equation (2) of the second embodiment, Equation (4) also means that the on-state current Iz changes to the opposite direction in response to a change in the on-state voltage Vz, and the effect of an individual difference of the Zener diode 7e is ed, but as the component 1/Rf is added to the second section coefficient on the left side of Equation (4), the on-state current Iz changes more in response to a change in the on-state voltage Vz.

Consequently, the present embodiment is a useful configuration when using a Zener diode that has a large individual difference in on-state voltage, or when it is necessary to restrict variation in the detection time Td2, and design with high precision.

A short circuit detection apparatus according to the third embodiment is such that by two resistors connected in series and connected in parallel to a capacitor, and a Zener diode connected in series to the capacitor, being provided as a voltage control circuit in this way, charging of the capacitor is carried out only in a range higher than an offset voltage, in the same way as in the first and second embodiments, because of which there is an advantage in that a short circuit of a semiconductor switching device can be detected and determined quickly, without a current of a constant current circuit being increased, in addition to which, when using a Zener diode in the voltage control circuit as in the second embodiment, an excellent advantage can be expected in that variation in a short circuit detection time can be restricted, even when there is an individual difference in on-state voltage characteristics of the Zener diode.

Heretofore, a description has been given of embodiments wherein a semiconductor switching device short circuit is quickly detected, without causing a current consumption of a short circuit detection apparatus to increase, and without causing a noise filtering advantage to decrease. Any of the embodiments may be employed in order to achieve the aforementioned objects, and omitting a function, or using the embodiments in combination, as necessary is arbitrary.

The present application has been described as being applied to, for example, a short circuit detection apparatus that detects a short circuit of a semiconductor switching device of an inverter of a power conversion device used for driving an automobile motor, but it goes without saying that the present application also functions in a case of detecting a short circuit of a semiconductor switching device used in another circuit device in which a semiconductor switching device is used. Also, an example wherein a transistor is used as a switch used in a voltage control circuit has been described, but the switch may be another active device, such as an FET.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments.

It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A short circuit detection apparatus, comprising:
a capacitor connected to a high potential side of a semiconductor switching device via a diode and a resistor connected in series;
a short circuit determination circuit that detects a terminal voltage of one terminal of the capacitor, and determines that the semiconductor switching device has short-circuited when the terminal voltage is equal to or greater than a threshold voltage; and
a voltage control circuit that is provided between another terminal of the capacitor and a low potential side of the semiconductor switching device, switches between a conduction and an interruption of the capacitor and the semiconductor switching device, and applies an offset voltage between the capacitor and the semiconductor switching device when conducting.

2. The short circuit detection apparatus according to claim 1, wherein the capacitor and the semiconductor switching device are conducted when the terminal voltage reaches the same potential as the offset voltage.

3. The short circuit detection apparatus according to claim 2, wherein the voltage control circuit is configured of a voltage detection circuit, which carries out a comparative determination of the terminal voltage and amplifies the terminal voltage, an offset voltage source that applies the offset voltage, and a transistor wherein a base terminal is connected to the voltage detection circuit, a collector terminal is connected to the capacitor, and an emitter terminal is connected to the offset voltage source, and causes the transistor to be conducted by an output voltage from the voltage detection circuit when the terminal voltage reaches the same potential as the offset voltage.

4. The short circuit detection apparatus according to claim 2, wherein the voltage control circuit is configured of a Zener diode, whose anode is connected to the low potential side of the semiconductor switching device and whose cathode is connected to the capacitor, and a second resistor, which is connected to the cathode of the Zener diode and is connected in parallel to the capacitor, and causes the Zener diode to be conducted when the terminal voltage reaches the same potential as a conduction voltage of the Zener diode, which corresponds to the offset voltage.

5. The short circuit detection apparatus according to claim 4, wherein a resistance value of the second resistor is adjusted in order that a current flowing through the second resistor is one-tenth or less of an output current of a constant current circuit that charges the capacitor.

6. The short circuit detection apparatus according to claim 5, comprising a third resistor in parallel with the Zener diode, wherein an individual difference in conduction voltage of the Zener diode is canceled by a current flowing through the third resistor and a current flowing through the Zener diode.

7. The short circuit detection apparatus according to claim 4, comprising a third resistor in parallel with the Zener diode, wherein an individual difference in conduction voltage of the Zener diode is canceled by a current flowing through the third resistor and a current flowing through the Zener diode.

8. The short circuit detection apparatus according to claim 1, wherein the offset voltage is set to be smaller than the threshold voltage, and the capacitor and the semiconductor switching device are caused to be conducted until the semiconductor switching device is determined to be short-circuited.

9. The short circuit detection apparatus according to claim 1, wherein the offset voltage is set to be equal to or smaller than the terminal voltage generated in an input of the short circuit determination circuit when the semiconductor switching device is driven normally, and the capacitor and the semiconductor switching device can be conducted when the semiconductor switching device is driven normally.

* * * * *